United States Patent [19]

Ishizuka et al.

[11] Patent Number: 5,731,127
[45] Date of Patent: Mar. 24, 1998

[54] PHOTOSENSITIVE COMPOSITION AND PHOTOSENSITIVE PLANOGRAPHIC PRINTING PLATE HAVING A RESIN WITH UREA BONDS IN THE SIDE CHAIN

[75] Inventors: Yasuhiro Ishizuka; Maru Aburano, both of Tatebayashi; Eiji Hayakawa, Utsunomiya; Koji Oe, Kitamoto, all of Japan

[73] Assignee: Dainippon Ink and Chemicals, Inc., Tokyo, Japan

[21] Appl. No.: 629,613

[22] Filed: Apr. 9, 1996

[30] Foreign Application Priority Data

| Apr. 11, 1995 | [JP] | Japan | 7-085345 |
| Apr. 11, 1995 | [JP] | Japan | 7-085346 |
| Feb. 6, 1996 | [JP] | Japan | 8-019911 |
| Feb. 6, 1996 | [JP] | Japan | 8-019912 |

[51] Int. Cl.$^6$ .......... G03F 7/021; G03F 7/023; G03F 7/033; G03C 1/77
[52] U.S. Cl. .......... 430/270.1; 430/165; 430/176; 430/192; 430/270.1; 430/275.1; 430/278.1; 430/287.1; 430/288.1; 430/302; 430/905; 430/910
[58] Field of Search .......... 430/155, 157, 430/165, 175, 176, 192, 193, 281.1, 278.1, 288.1, 287.1, 279.1, 302, 905, 910, 270.1; 101/456

[56] References Cited

U.S. PATENT DOCUMENTS

| 4,248,958 | 2/1981 | Faust | 430/905 |
| 4,275,138 | 6/1981 | Kita et al. | 430/157 |
| 4,293,635 | 10/1981 | Flint et al. | 430/281.1 |
| 4,294,905 | 10/1981 | Okishi et al. | 430/175 |
| 4,950,582 | 8/1990 | Aoai et al. | 430/281.1 |
| 5,340,685 | 8/1994 | Sekiya | 430/281.1 |

FOREIGN PATENT DOCUMENTS

| 0 243 890 | 11/1987 | European Pat. Off. |
| 0 468 667 | 1/1992 | European Pat. Off. |
| 0 607 962 | 7/1994 | European Pat. Off. |
| 35 36 608 | 4/1987 | Germany |
| A-54-98614 | 8/1979 | Japan |
| A-63-89864 | 4/1988 | Japan |
| A-63-261350 | 10/1988 | Japan |
| A-64-35436 | 2/1989 | Japan |
| A-64-52139 | 2/1989 | Japan |
| A-6-258828 | 9/1994 | Japan |
| A-6-258829 | 9/1994 | Japan |
| A-7-36185 | 2/1995 | Japan |
| A-7-333839 | 12/1995 | Japan |

OTHER PUBLICATIONS

Patent Abstracts of Japan, vol. 008, No.033, Feb. 14, 1984, JP 58 189627.

*Primary Examiner*—John S. Chu
*Attorney, Agent, or Firm*—Armstrong, Westerman, Hattori, McLeland & Naughton

[57] ABSTRACT

A photosensitive composition which comprises a resin (A) having urea bonds in its side chains and a photosensitive compound (B), wherein the resin (A) contains at least one resin selected from the group consisting of a vinyl polymer resin and a condensation polymer resin, provides a coating layer with excellent resistance to solvents and abrasion. The photosensitive composition is suitable for use in the production of planographic printing plates, integrated circuits (IC) or photomasks. A photosensitive planographic printing plate produced usig the photosensitive composition has superior press-life.

20 Claims, No Drawings

PHOTOSENSITIVE COMPOSITION AND PHOTOSENSITIVE PLANOGRAPHIC PRINTING PLATE HAVING A RESIN WITH UREA BONDS IN THE SIDE CHAIN

BACKGROUND OF THE INVENTION

1. Field of the invention

The present invention relates to a photosensitive composition suitable for use in the production of planographic printing plates, integrated circuits (IC) or photomasks. More specifically, the present invention relates to a photosensitive composition which provides a coating layer with excellent resistance to solvents and abrasion and to a photosensitive planographic printing plate which has superior press-life.

2. Description of the Related Art

Japanese Patent Application, First Publication, No. Sho 63-89864; Japanese Patent Application, First Publication, No. Hei 1-35436; and Japanese Patent Application, First Publication, No. Hei 1-52139; among others, disclose a photosensitive composition which includes as essential components a photosensitive composition consisting of o-naphthoquinone diazido sulfonic ester and a binder resin consisting of a resin having atomic groups in its side chains of the specific structures such as shown below. In addition, these references also disclose a positive working photosensitive planographic printing plate wherein the aforementioned photosensitive composition is provided on top of an aluminum support.

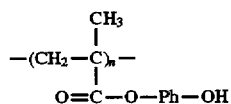

[a]

(where Ph indicates a phenylene group)

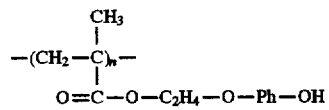

[b]

(where Ph indicates a phenylene group)

Further, Japanese Patent Application, First Publication, No. Sho 63-261350 discloses a photosensitive composition characterized in the inclusion of a polyurethane resin having a sulfonyl ureido group (—$SO_2$—NH—CO—NH—).

Japanese Patent Application, First Publication, No. Sho 54-98614 discloses a negative working photosensitive composition characterized in including as essential components a diazo resin and a high molecular compound having an aromatic hydroxyl group such as represented by the above chemical formula, for example.

However, the coating layers obtained from the photosensitive compositions containing a binder resin consisting of a resin having atomic groups of one of the above specific structures in its side chains which are disclosed in the aforementioned publications all lack sufficient resistance to solvents. In particular, resistance is poor in the case of cleaning agents which include solvents employed in UV ink printing. Further, coating layer abrasion is also large, resulting in insufficient press-life.

Moreover, the polyurethane resin having a sulfonyl ureido group disclosed in Japanese Patent Application, First Publication, No. Sho 63-261350 has the disadvantage in that, when it is employed in a photosensitive composition, the image developing characteristics deteriorate. Further, gelling occurs readily in the synthesis of this polyurethane resin, making it difficult to employ as a photosensitive composition.

SUMMARY OF THE INVENTION

Accordingly, the present inventors synthesized a variety of resins having atomic groups of specific structures in the side chains, and from these formulated photosensitive compositions. The characteristics of these photosensitive compositions were evaluated, leading to the discovery that a photosensitive composition which includes a binder resin consisting of a resin having urea bonds in its side chains demonstrates superior resistance to solvents as compared to known photosensitive compositions which include a binder resin consisting of a resin having atomic groups of the aforementioned specific structures in the side chains. Accordingly, with this discovery, the present invention was completed.

In other words, the present invention offers a photosensitive composition characterized in the inclusion of a photosensitive compound and a condensation polymer or vinyl polymer type resin which has urea bonds in its side chains. In addition, the present invention also offers a photosensitive planographic printing plate having a photosensitive layer consisting of this composition.

The coating layer obtained from the photosensitive resin composition of the present invention has superior resistance to solvents and excellent image developing characteristics. When employed as a planographic printing plate, it also demonstrates excellent resistance to solvents and superior press-life. In particular, this coating layer also demonstrates good press-life in UV ink printing because of its excellent resistance to solvents.

DESCRIPTION OF THE PREFERRED EMBODIMENTS

A detailed explanation will now be made of the composition of the present invention, the vinyl polymer or condensation polymer type resin having urea bonds in its side chains which is employed in the production of the present invention's composition, the other components of the composition, and the production method for the present invention's planographic printing plate.

The condensation polymer or vinyl polymer type resin (A) having urea bonds in its side chains which is employed in the present invention may be any resin obtained from vinyl polymer type resins such as polyacrylates, polystyrenes, polyvinyl ethers, or polyacrylonitriles; or from condensation polymer type resins such as novolaks, polyesters, or polyamides. Any these may be suitably employed in the present invention.

Further, when developing the photosensitive composition of the present invention in an aqueous alkaline developer, it is preferable that the resin (A) having urea bonds in its side chains be a vinyl or condensation polymer type alkaline soluble resin (a) which has urea bonds in its side chains.

Accordingly, because the urea bonds themselves are not employed as the alkaline soluble groups, it is preferable that resin (A) having urea bonds in its side chains have an alkaline soluble group such as, for example, a phenolic hydroxyl group, carboxyl group, sulfonic acid group, phosphoric acid group, sulfonamide group, or active imide group, present separately in the resin skeleton. However, a phenolic hydroxyl group is more preferably employed from the perspective of further improving the image developing characteristics. In the case where increasing the sensitivity of the photosensitive composition, or rendering development possible with a developer of markedly low activity, however, a carboxylic group or sulfonamide group may be included in the resin skeleton.

Moreover, by locating the urea bonds adjacent to a functional group such as a sulfonyl group which has strong electronic absorption, the urea bonds themselves may be rendered alkaline soluble. However, from the perspective of the image developing characteristics, it is suitable to employ a resin which has a phenolic hydroxyl group as the alkaline soluble group and has urea bonds in its side chains.

Due to their ease of synthesis, vinyl polymer type resins may be cited as one example of the type of resin suitably employed as a binder resin in the photosensitive composition of the present invention. Further, when this vinyl polymer type binder resin contains (meth)acrylonitrile or (meth)acrylamide as a copolymer component for example, the resistance to solvents of the photosensitive composition is even more suitable.

The resistance to solvents containing alcohols in particular tends to become stronger in photosensitive compositions which employ a binder resin containing (meth)acrylonitrile as a copolymer unit. Specifically, there is a marked appearance of this effect when the amount of (meth)acrylonitrile exceeds 60 molar percent of the total amount of polymerizable monomers which form the binder resin. In other words, the greater the amount of (meth)acrylonitrile, the stronger the resistance to solvents becomes. However, when the obtained resin is employed as the binder resin of a photosensitive composition that can be developed with an alkaline solution, then it is necessary to include an alkaline soluble group such as those listed above, for example, in the resin. Accordingly, it is preferable that the (meth) acrylonitrile included in the resin comprise in excess of 60 molar percent and not more than 90 molar percent of the polymerizable monomers which form the resin.

Moreover, examples of (meth)acrylonitriles suitably employed preferably include at least one compound selected from among acrylonitriles like acrylonitrile or methacrylonitrile. Of these, acrylonitrile is more preferable, however.

A photosensitive composition employing a binder resin which contains (meth)acrylamide also exhibits a tendency of increasing resistance to various types of solvents, and is thus suitably employed. The proportion of (meth)acrylamide comprising the polymerizable monomers which form the binder resin is preferably in the range of 5 to 20 molar percent based on an appraisal of the range in which suitable image developing characteristics are obtained. Further, examples of suitably employed (meth)acrylamides preferably include at least one compound selected from acrylamides like acrylamide or methacrylamide. Methacrylamide is more preferable, however.

Further, resistance to solvents is even more suitable in the case where (meth)acrylonitrile and (meth)acrylamide are employed together in the binder resin of the present invention. For the reasons stated above, it is further preferable that the proportion of the (meth)acrylonitrile exceed 60 molar percent and not more than 90 molar percent, and the proportion of (meth)acrylamide be in the range of 5 to 20 molar percent, with respect to the total amount of polymerizable monomers which form the binder resin.

Not only does resistance to various types of solvents improve in the case of this kind of photosensitive composition employing a binder resin, but resistance to abrasion also improves. Accordingly, this photosensitive composition also demonstrates other excellent properties such as a marked improvement in press-life in the case where used as a planographic printing plate for UV ink printing.

A photosensitive composition which employs a resin containing (meth)acrylamide as a copolymer component as binder resin (A) not only has excellent resistance to solvents which contain alcohols, but also has improved resistance to abrasion as compared to a binder resin (A) which contains only (meth)acrylonitrile as a copolymer component. In particular, when this photosensitive composition is employed as a photosensitive layer of a planographic printing plate used in UV ink printing, it displays such excellent properties as a marked improvement in press-life.

A known photosensitive compound may be optimally selected depending on whether a positive or negative working composition is to be formulated, and employed as a photosensitive compound (B) which is employed in the present invention's photosensitive composition. Specifically, this photosensitive composition may be selected from among the following four compounds, for example:

1) o-naphthoquinone diazido compound;
2) photosensitive diazonium compound;
3) combination of a compound having ethylenic unsaturated groups and photopolymerization initiator; and
4) combination of photosensitive diazonium compound, compound having ethylenic unsaturated groups and photopolymerization initiator.

o-naphthoquinone diazido compounds are available as specific examples of a positive working photosensitive compound. Further, the compound disclosed in Japanese Patent Application, Second Publication, No. Sho 43-28403, which is an ester of 1,2-diazonaphthoquinone sulfonyl chloride and a pyrogallol-acetone resin, is preferable as the o-naphthoquinone diazido compound used in the present invention.

Other examples of suitable orthoquinone diazido compounds include the ester of 1,2-diazonaphthoquinone sulfonyl chloride and phenol-formaldehyde resin disclosed in the specifications of U.S. Pat. No. 3,046,120 and U.S. Pat. No. 3,188,210.

Other effective o-naphthoquinone diazido compounds are well known, being disclosed in numerous patents. For example, further examples may be cited from among the compounds disclosed in the specifications of Japanese Patent Application, First Publication, No. Sho 47-5303; Japanese Patent Application, First Publication, No. Sho 48-63802; Japanese Patent Application, First Publication, No. Sho 48-63803; Japanese Patent Application, First Publication, No. Sho 48-96575; Japanese Patent Application, First Publication, No. Sho 49-38701; and Japanese Patent Application, First Publication, No. Sho 48-13354; Japanese Patent Application, Second Publication, No. Sho 37-18015; Japanese Patent Application, Second Publication, No. Sho 41-11222; Japanese Patent Application, Second Publication, No. Sho 45-9610; and Japanese Patent Application, Second Publication, No. Sho 49-17481; among others.

The o-naphthoquinone diazido compound which is particularly preferable for use in the present invention is obtained by reacting a polyhydroxy compound of a molecular mass of 1,000 or less with 1,2-diazonaphthoquinone sulfonyl chloride. Specific examples of a compound such as this are disclosed in Japanese Patent Application, First Publication, No. Sho 51-139402; Japanese Patent Application, First Publication, No. Sho 58-150948; Japanese Patent Application, First Publication, No. Sho 58-203434; Japanese Patent Application, First Publication, No. Sho 59-165053; Japanese Patent Application, First Publication, No. Sho 60-121445; Japanese Patent Application, First Publication, No. Sho 60-134235; Japanese Patent Application, First Publication, No. Sho 60-163043; Japanese Patent Application, First Publication, No. Sho 61-118744; Japanese Patent Application, First Publication, No. Sho 62-10645; Japanese Patent Application, First Publication, No. Sho 62-10646; Japanese Patent Application, First Publication, No. Sho 62-153950; and Japanese Patent Application, First Publication, No. Sho 62-178562; among others.

When Synthesizing these o-naphthoquinone diazido compounds, it is preferable to react 1,2-diazonaphthoquinone sulfonyl chloride in the amount of 0.2 to 1.2 weight equivalents, and more preferably in the amount of 0.3 to 1.0 weight equivalents, with respect to the hydroxyl groups in the polyhydroxy compound.

A mixture of o-naphthoquinone diazido compounds which differ with respect to the position of introduction and the amount introduced of the 1,2-diazonaphthoquinone sulfonic ester group are obtained from the reaction. However, it is preferable that compounds in which all the hydroxyl groups have been substituted by 1,2-diazonaphthoquinone sulfonic ester comprise 5 molar percent or more, and more preferably 20 to 100 molar percent, of the mixture in total.

Further, other examples may be cited of a positive working photosensitive compound in addition to o-naphthoquinone diazido compounds, including, for example, the compounds disclosed in Japanese Patent Application, Second Publication, No. Sho 56-2696; Japanese Patent Application, First Publication, No. Sho 48-89003; Japanese Patent Application, First Publication, No. Sho 51-120714; Japanese Patent Application, First Publication, No. Sho 53-133429; Japanese Patent Application, First Publication, No. Sho 55-12995; Japanese Patent Application, First Publication, No. Sho 55-126236; Japanese Patent Application, First Publication, No. Sho 56-17345; Japanese Patent Application, First Publication, No. Sho 60-10247; Japanese Patent Application, First Publication, No. Sho 60-37549; and Japanese Patent Application, First Publication, No. Sho 60-121446; among others.

Moreover, the compounds or combinations listed in 2) through 4) above are available as photosensitive compounds which may be employed in a negative working photosensitive composition. However, more specifically, the following examples may be cited.

Namely, diazo resins typified by the salt of a condensate of diazodiarylamine and an active carbonyl compound are available as examples of a photosensitive diazonium compound, with the compound employed preferably being one which is photosensitive, insoluble in water and soluble in an organic solvent.

In particular, suitable diazo resins include an organic acid salt or inorganic acid salt of a condensate of at least one compound selected from among 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine, 4-diazo-3-methoxydiphenylamine and the like; and one compound selected from among formaldehyde, paraformaldehyde, acetoaldehyde, benzoaldehyde, 4,4'-bis-methoxymethyldiphenyl ether and the like.

Examples of the organic acid include methanesulfonic acid, benzenesulfonic acid, tolulenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, 2-hydroxy-4-methoxybenzophenone-5-sulfonic acid, 2,4-dihydroxybenzophenone, and benzenephosphinic acid or the like. Examples of the inorganic acid include hexafluorophosphoric acid, tetrafluoroboric acid, thiocyanic acid and the like.

In addition, other diazo resins may be employed, these including, for example, the diazo resins disclosed in Japanese Patent Application, First Publication, No. Sho 54-50121, in which the main chain is a polyester group; the diazo resins disclosed in Japanese Patent Application, First Publication, No. Sho 61-273538, which are formed by reacting a polymer having an anhydrous carbonic acid residue and a diazo compound having a hydroxyl group; a diazo resin formed by reacting a polyisocyanate compound and a diazo compound having a hydroxyl group; a diazo resin having a carboxyl group; and a diazo resin having a phenolic hydroxyl group.

The amount of these diazo resins used is preferably in the range of 1 to 40% by weight with respect to the solid component of the composition. Further, two or more diazo resins may be used in combination as necessary.

Further, monomers or oligomers which have a boiling point of 100° C. or higher under normal pressure, and have at least one, but preferably two or more, addition polymerizable ethylenic unsaturated groups per molecule are available as examples of compounds having an ethylenic unsaturated group. Examples of such monomers or oligomers include monofunctional (meth)acrylates like polyethylene glycol mono(meth)acrylate (hereinafter, methacrylates and acrylates will be grouped together under the term "(meth)acrylate"), polypropylene glycol mono(meth)acrylate, phenoxyethyl(meth)acrylate and the like; and multifunctional (meth)acrylates like polyethylene glycol di(meth)acrylate, polypropylene glycol di(meth)acrylate, trimethylolpropane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, tri(acryloyloxyethyl) isocyanulate, (meth)acrylates of an adduct of polyhydric alcohols and alkyleneoxides, (meth)acrylates of an adduct of polyhydric phenols and alkyleneoxides, the urethane acrylates disclosed in Japanese Patent Application, Second Publication, No. Sho 48-41708; Japanese Patent Application, Second Publication, No. Sho 50-6034; and Japanese Patent Application, Second Publication, No. Sho 51-37193; polyester acrylates disclosed in Japanese Patent Application, First Publication, No. Sho 48-64183; Japanese Patent Application, Second Publication, No. Sho 49-43191; and Japanese Patent Application, Second Publication, No. Sho 52-30490; and epoxy (meth)acrylates in which a (meth)acrylic acid has been added to an epoxy resin.

Further, a resin having both urea bonds and ethylenic unsaturated groups in its side chains may be employed as resin (A). For example, when the negative compositions 3) or 4) from among the negative compositions 2) through 4) listed above is employed in a photosensitive compound (B), then a resin having both urea bonds and ethylenic unsaturated groups in its side chains may be employed as resin (A). When negative composition 4) listed above is employed in photosensitive compound (B), then a coating layer which has an even more excellent resistance to solvents is obtained by employing a resin (A) which has both urea bonds and ethylenic unsaturated groups in its side chains than when employing a resin (A) which only has urea bonds and no ethylenic unsaturated groups.

The present invention's resin (D), which has an ethylenic unsaturated group and a structure represented by general formula [I], may be cited as one example of the aforementioned resin. A resin having both urea bonds and an ethylenic unsaturated group in its side chains may be suitably employed alone or along with the aforementioned known compounds having ethylenic unsaturated groups, and combined with a photopolymerization initiator. Further, if a photosensitive diazonium compound is also combined in this system, then adhesiveness to the substrate is further improved, thereby obtaining a negative working photosensitive planographic printing plate having excellent press-life. Because resin (A) includes the structure represented by general formula [I], development with an aqueous alkaline solution is made possible, and the image developing characteristics become excellent when this is employed as a planographic printing plate. Further, the greater the amount of ethylenic unsaturated groups included in the resin, the greater the degree of sensitivity of the obtained photosensitive composition. Further, press-life when employed as a planographic printing plate also improves. Examples of a resin (D) of this type include a resin wherein the isocyanate compound represented by general formula [III] is added to a polymer of the compound represented by general formulas [II] and a compound having one vinyl group and one or a plurality of hydroxyl groups per molecule. When the compound represented by general formula [IIa] which has a phenolic hydroxyl group is employed from among the compounds represented by general formulas [II], the ink receptivity when employed as a planographic printing plate is markedly improved. Thus, this compound is even more suitably employed. Examples of a compound having one vinyl group and one or a plurality of hydroxyl groups per molecule include hydroxyalkyl(meth)acrylates such as 2-hydroxyethyl(meth)acrylate and 2-hydroxypropyl(meth) acrylate; acryl amide derivatives such as N-methylolacryl amide; and the compounds represented by general formula [IIa]. Specific examples of a resin (D) suitably employed in the present invention include a resin wherein methacryloyloxyethylisocyanate (also known as 2-isocyanate ethylmethacrylate) is added to a polymer of 2-(N'-(4-hydroxyphenyl)ureido)ethylmethacrylate and 2-hydroxyethylmethacrylate. Resin (D) may be employed alone as a compound having ethylenic unsaturated groups, or in combination with the aforementioned known compounds having ethylenic unsaturated groups.

The amount added of these addition polymerizable compounds having ethylenic unsaturated groups is preferably in the range of 5 to 70% by weight with respect to the solid component of the composition.

Examples of a photopolymerization initiator include the α-carbonyl compounds disclosed in U.S. Pat. No. 2,367,661; acyloin ethers disclosed in U.S. Pat. No. 2,448,828; aromatic acyloin compounds substituted by α-hydrocarbons disclosed in U.S. Pat. No. 2,722,512; polycyclic aromatic quinone compounds disclosed in U.S. Pat. No. 3,046,127; the combination of triarylbiimidizole and p-aminophenylketone disclosed in U.S. Pat. No. 3,549,367; trihalomethyl-s-triazine type compounds disclosed in U.S. Pat. No. 4,239,850; oxadiazole type compounds disclosed in U.S. Pat. No. 4,212,970; acridine and phenazine compounds disclosed in U.S. Pat. No. 3,751,259; and benzothiazole type compounds disclosed in Japanese Patent Application, Second Publication, No. Sho 51-48516. The amount of these compounds employed is preferably in the range of 0.5 to 20% by weight with respect to the solid component of the composition.

The present invention will now be explained employing the example of a positive working photosensitive composition.

When the photosensitive composition of the present invention contains an o-naphthoquinone diazido compound and a condensation polymer or vinyl polymer type resin having urea bonds in its side chains, it may be employed as a positive working photosensitive composition which has excellent image developing characteristics when development is carried out with an alkaline developer.

The condensation polymer or a vinyl polymer type resin having urea bonds in its side chains which is employed in the present invention may include a variety of structures. However, resins which include the structural units represented by general formulas [I] (formulas [Ia] through [Ic] below) may be cited as examples of resins which are suitably employed.

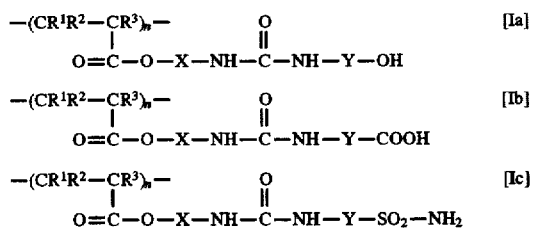

In the above formulas [Ia] through [Ic], $R^1$ and $R^2$ respectively represent a hydrogen atom, halogen atom, alkyl group, aryl group, carboxyl group, or a salt thereof; $R^3$ represents a hydrogen atom, halogen atom, alkyl group, or aryl group; X indicates a bivalent linking group; and Y represents a bivalent aromatic group which may have substituents.

Examples of X include an alkylene group or phenylene group which may have substituents. Examples of Y include a phenylene group or naphthalene group which may have substituents.

In particular, a composition formulated from a resin obtained employing [Ia] and [Ic] is preferable to one formulated from a resin obtained employing [Ib] because the resistance of the coating layer to solvents is excellent. However, for all three formulas, it is preferable that Y to which a carboxyl group, hydroxyl group or sulfonamide group is bonded represent a 1,4-phenylene group which may have substituents. In particular, from the perspective of resistance to solvents, it is even more preferable that Y represent a 1,4-phenylene group which does not have substituents. Further, employing a hydroxyl group or sulfonamide group as the function group at position 4 is preferable as better resistance to solvents is obtained than in the case where a carboxyl group is employed at this position. Most preferable is formula [Ia] or [Ic] wherein Y is a 1,4-phenylene group which does not have substituents.

A photosensitive composition wherein a resin having the structural units shown by general formula [I] is employed as a binder resin demonstrates excellent properties with respect to image developing characteristics, and resistance to solvents and abrasion.

Further, of the resin containing the structural units shown by general formula [I], the resin which is suitably employed in the present invention is one in which the structural units shown by general formula [I] comprise 10 to 80 parts per 100 parts by weight of the resin. When this resin is employed as a binder resin, even more superior properties with respect to image developing characteristics and resistance to solvents and abrasion are demonstrated.

In addition, other known alkaline soluble resins may be included in the present invention's positive working photosensitive composition, examples including novolak or resol resins such as phenol-formaldehyde resin, m-cresol-formaldehyde resin, p-cresol-formaldehyde resin, m-/p-mixed cresol-formaldehyde resin, phenol/cresol (m-, p- or m-/p-mixed) mixed formaldehyde resin, and resorcinol-formaldehyde resin; polyhydroxystyrene or the like. A wider latitude for development of the present invention's photosensitive composition is permitted when these known resins are employed. In addition to resin (A), novolak resins are particularly preferably employed in combination with the o-quinone diazido compound (B). It is preferable that these alkaline soluble resins have a number average molecular weight in the range of 200 to 20,000, and a weight average molecular weight in the range of 300 to 60,000.

Further, as disclosed in U.S. Pat. No. 4,123,279, it is preferable to also employ a condensate of formaldehyde and phenol having alkyl groups of 3 to 8 carbons as substituents, such as t-butylphenol-formaldehyde resin or octylphenol novolak resin, as this improves the oleophilicity of the image.

The present invention's photosensitive composition can be suitably employed as a photosensitive composition for use in a planographic printing plate, and in particular, as a positive working composition, by means of the addition of 10 to 50 parts by weight of an o-naphthoquinone diazido compound (B) with respect to 100 parts by weight of a binder resin consisting of an aforementioned novolak resin (C) and a condensation polymer or vinyl polymer type resin (A) having urea bonds, resin (A) being contained in the binder resin in the amount of 5 to 95 parts by weight per 100 parts by weight of the binder resin.

The resin employed in the present invention which includes the structure represented by general formula [I] may be synthesized by a variety of methods. For example, it may be obtained by using a known polymerization initiator in a suitable solvent to polymerize polymerizable monomers having one or more urea bonds and one or more polymerizable unsaturated bonds per molecule.

As examples of polymerizable monomers having one or more urea bonds and one or more polymerizable unsaturated bonds per molecule, the compounds represented by general formulas [II] (formulas [IIa] through [IIc] below) may be cited.

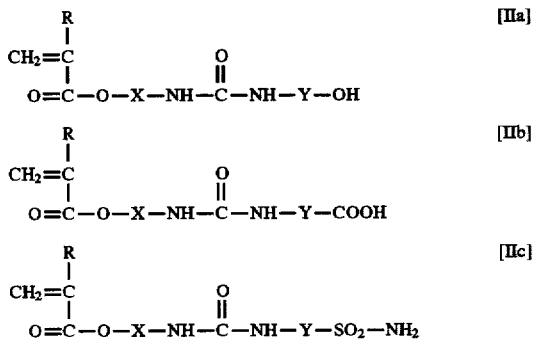

[Wherein, R represents a hydrogen atom, halogen atom, alkyl group, or aryl group; X indicates a bivalent linking group; and Y represents a bivalent aromatic group which may have substituents.]

These types of polymerizable monomers having one or more urea bonds and one or more polymerizable unsaturated bonds per molecule made be produced by a method such as follows, for example.

Namely, an isocyanate compound represented by the following general formula [III] and an amine compound represented by the following general formula [IV] are reacted to obtain a polymerizable monomer having one or more urea bonds and one or more polymerizable unsaturated bonds per molecule.

[Wherein, R indicates a hydrogen atom or alkyl group and X indicates a bivalent linking group.]

Examples of X include an alkylene group or phenylene group which may have substituent groups.

[Wherein, R' is a hydrogen atom or an alkyl group which may have substituents, Y is a bivalent aromatic group which may have substituents, and Z is a hydroxy, carboxyl group or sulfonamide group.]

Examples of Y include a phenylene group or naphthylene group which may have substituents.

The polymerizable monomer represented by general formula [IIa] may be obtained by carrying out the above reaction employing the compounds represented by the above general formulas [III] and [IV] in which X is an alkylene group, Y is a phenylene or naphthylene group which may have substituent groups, Z is a hydroxyl group, and R' is a hydrogen atom.

Additionally, since an amino group demonstrates relatively higher activity with respect to an isocyanate group than does a hydroxyl group, carboxyl group, or —NH—CO— group, the monomer represented by structure [II] can be readily obtained. Further, also effective are methods wherein the above reaction is carried out at a temperature in the range of 0° to 40° C., or wherein the isocyanate compound [III] is added in small amounts gradually to a system of excess amine compound [IV].

When carrying out the aforementioned reaction, an organic solvent from among those commonly used listed below which does not have active hydrogen atoms is suitably employed. The duration of the reaction may be carried out until the isocyanate group disappears or until the amount of urea bonds becomes constant, with the normal reaction time being 15 minutes to 24 hours.

The reaction mixture obtained in this way may be employed without alteration as monomer [II]. However, as necessary, the reaction mixture may be neutralized with an acidic compound such as diluted hydrochloric acid with the goal of removing by-products or unreacted material in the case where the reaction was carried in a system of excess compound [IV]. A salt of compound [IV] is thus formed. A highly pure monomer [II] can then be obtained by washing, filtering and vacuum drying.

The monomer [II] obtained in this way demonstrates characteristic absorption at 1600 to 1700 cm$^{-1}$ on the infrared absorption spectrum corresponding to the urea bonds. Thus, if this is measured, then identification of an identical substance becomes possible. Identification is also possible using melting points, proton NMR, or the like.

The compound represented by the following general formula [IIa] is available as a polymerizable monomer suitably employed in the present invention.

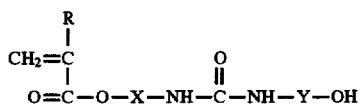

[IIa]

[Wherein, R indicates a hydrogen atom or alkyl group, X indicates a bivalent linking group, and Y is a bivalent aromatic group which may have substituents.

Further, all of the aforementioned groups may be cited as specific examples of X and Y.

Examples of this type of polymerizable monomer include acrylate derivatives such as 1-(N'-(4-hydroxyphenyl)ureido) methylacrylate, 1-(N'-(3-hydroxyphenyl)ureido) methylacrylate, 1-(N'-(2-hydroxyphenyl)ureido) methylacrylate, 1-(N'-(3-hydroxy-4-methylphenyl)ureido) methylacrylate, 1-(N'-(2-hydroxy-5-methylphenyl)ureido) methylacrylate, 1-(N'-(5-hydroxynaphtyl)ureido) methylacrylate, 1-(N'-(2-hydroxy-5-phenylphenyl)ureido) methylacrylate, 2-(N'-(4-hydroxyphenyl)ureido) ethylacrylate, 2-(N'-(3-hydroxyphenyl)ureido)ethylacrylate, 2-(N'-(2-hydroxyphenyl)ureido)ethylacrylate, 2-(N'-(3-hydroxy-4-methylphenyl)ureido)ethylacrylate, 2-(N'-(2-hydroxy-5-methylphenyl)ureido)ethylacrylate, 2-(N'-(5-hydroxynapthyl)ureido)ethylacrylate, 2-(N'-(2-hydroxy-5-phenylphenyl)ureido)ethylacrylate, 4-(N'-(4-hydroxyphenyl)ureido)butylacrylate, 4-(N'-(3-hydroxyphenyl)ureido)butylacrylate, 4-(N'-(2-hydroxyphenyl)ureido)butylacrylate, 4-(N'-(3-hydroxy-4-methylphenyl)ureido)butylacrylate, 4-(N'-(2-hydroxy-5-methylphenyl)ureido)butylacrylate, 4-(N'-(5-hydroxynapthyl)ureido)butylacrylate, 4-(N'-(2-hydroxy-5-phenylphenyl)ureido)butylacrylate, and the like; and methacrylate derivatives such as 1-(N'-(4-hydroxyphenyl)ureido) methylmethacrylate, 1-(N'-(3-hydroxyphenyl)ureido) methylmethacrylate, 1-(N'-(2-hydroxyphenyl)ureido) methylmethacrylate, 1-(N'-(3-hydroxy-4-methylphenyl) ureido)methylmethacrylate, 1-(N'-(2-hydroxy-5-methylphenyl)ureido)methylmethacrylate, 1-(N'-(5-hydroxynapthyl)ureido)methylmethacrylate, 1-(N'-(2-hydroxy-5-phenylphenyl)ureido)methylmethacrylate, 2-(N'-(4-hydroxyphenyl)ureido)ethylmethacrylate, 2-(N'-(3-hydroxyphenyl)ureido)ethylmethacrylate, 2-(N'-(2-hydroxyphenyl)ureido)ethylmethacrylate, 2-(N'-(3-hydroxy-4-methylphenyl)ureido)ethylmethacrylate, 2-(N'-(2-hydroxy-5-methylphenyl)ureido)ethylmethacrylate, 2-(N'-(5-hydroxynapthyl)ureido)ethylmethacrylate, 2-(N'-(2-hydroxy-5-phenylphenyl)ureido)ethylmethacrylate, 4-(N'-(4-hydroxyphenyl)ureido)butylmethacrylate, 4-(N'-(3-hydroxyphenyl)ureido)butylmethacrylate, 4-(N'-(2-hydroxyphenyl)ureido)butylmethacrylate, 4-(N'-(3-hydroxy-4-methylphenyl)ureido)butylmethacrylate, 4-(N'-(2-hydroxy-5-methylphenyl)ureido)butylmethacrylate, 4-(N'-(5-hydroxynapthyl)ureido)butylmethacrylate, 4-(N'-(2-hydroxy-5-phenylphenyl)ureido)butylmethacrylate, and the like.

Additionally, 2-(N'-(4-hydroxyphenyl)ureido) ethylmethacrylate has a melting point of 131° to 133° C., and can be identified from its IR spectrum absorption corresponding to the hydroxyl groups and the urea bonds.

Further, other examples of the polymerizable monomer having polymerizable unsaturated bonds and urea bonds which are suitably employed in the present invention include acrylates with acidic groups such as 2-(N'-(4-carboxylphenyl)ureido)ethylacrylate, 2-(N'-(4-sulfamoylphenyl)ureido)ethylacrylate, 2-(N'-(4-sulfophenyl)ureido)ethylacrylate, 2-(N'-(4-phosphonophenyl)ureido)ethylacrylate, and the like; methacrylates with acidic groups such as 2-(N'-(4-carboxylphenyl)ureido)ethylmethacrylate, 2-(N'-(4-sulfamolyphenyl)ureido)ethylmethacrylate, 2-(N'-(4-sulfophenyl)ureido)ethylmethacrylate, 2-(N'-(4-phosphophenyl)ureido)ethylmethacrylate, and the like; acrylates which do not have acidic groups such as 2-(N'-methylureido)ethylacrylate, 2-(N'-propylureido) ethylacrylate, 2-(N'-phenylureido)ethylacrylate, 2-(N'-(4-methylphenyl)ureido)ethylacrylate, 2-(N'-(2-methylphenyl) ureido)ethylacrylate, 2-(N'-napthylureido)ethylacrylate, 2-(N'-(2-phenylphenyl)ureido)ethylacrylate, and the like; and methacrylates which do not have acidic groups such as 2-(N'-methylureido)ethylmethacrylate, 2-(N'-propylureido) ethylmethacrylate, 2-(N'-phenylureido)ethylmethacrylate, 2-(N'-(4-methylphenyl)ureido)ethylmethacrylate, 2-(N'-(2-methylphenyl)ureido)ethylmethacrylate, 2-(N'-napthylureido)ethylmethacrylate, 2-(N'-(2-phenylphenyl) ureido)ethylmethacrylate and the like.

Additionally, 2-(N'-(4-carboxyphenyl)ureido) ethylmethacrylate has a decomposition temperature of 220° C., and can be identified from its IR spectrum absorption corresponding to the carboxyl groups and urea bonds.

The condensation polymer or vinyl polymer type alkaline soluble resin (a) having urea bonds in its side chains which is suitably employed in the present invention may be a homopolymer of a polymerizable monomer or two or more of polymerizable monomers, the monomer having polymerizable unsaturated bonds and urea bonds, or may be a copolymer of two or more compounds. However, it is preferable that alkaline soluble resin (a) be a copolymer of one or more compounds which have at least one or more polymerizable unsaturated bonds and do not contain urea bonds.

Specific examples thereof include acrylic esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, tetrahydroacrylate and the like; aryl acrylates such as phenyl acrylate, furfuryl acrylate and the like; methacrylic esters such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate and the like; aryl methacrylates such as phenyl methacrylate, cresyl methacrylate and naphthyl methacrylate, and the like;

as acryl amides or derivatives thereof, N-alkylacryl amides like N-methylacryl amide, N-ethylacryl amide, N-propylacryl amide, N-butylacryl amide, N-t-butylacryl amide, N-heptylacryl amide, N-octylacryl amide, N-cyclohexylacryl amide, N-benzylacryl amide, and the like; N-arylacryl amides like N-phenylacryl amide, N-tolylacryl amide, N-nitrophenylacryl amide, N-naphthylacryl aide, N-hydroxyphenylacryl amide, and the like; N,N-dialkylacryl amides like N,N-dimethylacryl amide, N,N-diethylacryl amide, N,N-dibutylacryl amide, N,N-diisobutylacryl amide, N,N-diethylhexylacryl amide, N,N-dicyclohexylacryl amide, and the like; and N,N- arylacryl amides like N-methyl-N-phenylacryl amide, N-hydroxyethyl-N-methylacryl amide, N-2-acetoamide ethyl-N-acetylacryl amide, and the like; as methacryl amides and derivatives thereof, N-alkylmethacryl amides like N-methylmethacryl amide, N-ethylmethacryl amide, N-propylmethacryl amide, N-butylmethacryl amide, N-t-butylmethacryl amide, N-ethylhexylmethacryl amide, N-hydroxyethylmethcryl amide, cyclohexyl methacryl amide, and the like; N-arylmethacryl amides like N-phenylmethacryl amide, N-naphthylmethacryl amide, and the like; N,N-dialkylmethacryl amides like N,N-diethylmethacyl amide, N,N-dipropylmethacryl amide, N,N-dibutylmethacryl amide and the like; N,N-diarylmethacryl amides like N,N-diphenylmethacryl amide and the like; and methacryl amide derivatives like N-hydroxyethyl-N-methylmethacryl amide, N-methyl-N-phenylmethacryl amide, N-ethyl-N-phenylmethacryl amide and the like;

allyl compounds such as allyl acetate, allyl caproate, allyl caprylate, allyl laurate, allyl palmitate, allyl stearate, allyl benzoate, allyl acetoacetate, allyl lactate, allyloxyethanol, and the like; vinyl ethers such as hexylvinyl ether, octylvinyl ether, dodecylvinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinyl phenyl ether, vinyl tolyl ether, vinyl chlorophenyl ether, vinyl-2,4-dichlorophenyl ether, vinylnaphthyl ether, vinyl anthranyl ether, and the like; vinyl esters such as vinyl butylate, vinyl isobutylate, vinyl trimethyl acetate, vinyl diethyl acetate, vinyl valerate, vinyl caproate, vinyl chloroacetate, vinyl methoxy acetate, vinyl butoxy acetate, vinyl phenyl acetate, vinyl acetoacetate, vinyl lactate, vinyl-$\beta$-phenylbutylate, vinyl cyclohexyl carboxylate, vinyl benzoate, vinyl salicylate, vinyl chlorobenzoate, vinyl tetrachlorobenzoate, vinyl naphtholate and the like; styrenes such as methyl styrene, dimethyl styrene, trimethyl styrene, ethyl styrene, diethyl styrene, isopropyl styrene, butyl styrene, hexyl styrene, cyclohexyl styrene, dodecyl styrene, benzyl styrene, chloromethyl styrene, trifluoromethyl styrene, ethoxymethyl styrene, acetoxymethyl styrene, methoxy styrene, 4-methoxy-3-methyl styrene, dimethoxy styrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethyl styrene, 4-fluoro-3-trifluoromethyl styrene, and the like; ester crotonates such as butyl crotonate, hexyl crotonate, crotonic acid, glycerin monocrotonate and the like; dialkyls of itaconates such as dimethyl itaconate, diethyl itaconate, dibutyl itaconate and the like; dialkls of maleic acid or fumaric acid such as dimethyl maleate and dibutyl fumarate; maleimides such as maleimide, N-phenyl maleimide, N-2-methylphenyl maleimide, N-2,6-diethylphenyl maleimide, N-2-chlorophenyl maleimide, N-cyclohexyl maleimide, N-lauryl maleimide, N-hydroxyphenyl maleimide, and the like; as well as N-vinyl pyrolidone, N-vinyl pyridine, acrylonitrile, methacrylonitrile and the like.

From among these compounds having polymerizable unsaturated bonds, suitably employed are (meth)acrylic esters {(meth)acrylates}, (meth)acryl amides, maleimides and (meth)acrylonitriles.

From the prospective of the coating layer's resistance to solvents, a copolymer of a monomer mixture which includes both (meth)acrylonitrile in excess of 60 molar percent and not more than 90 molar percent and (meth)acryl amide is superior as the alkaline soluble acrylic type resin binder.

These suitably employed compounds may also be used together with (meth)acrylic acids.

Further, the terms "(meth)acrylate" or "(meth)acrylic acid" as used in the present invention refer not only to acrylates and acrylic acids, but also to methacrylates and methacrylic acids respectively. Additionally, the term "(meth)acrylonitrile" includes acrylonitriles and methacrylonitriles, while the term "(meth)acryl amide" includes both acryl amides and methacryl amides.

A copolymer of one or more of these compounds having polymerizable unsaturated bonds and one or more of these compounds having polymerizable unsaturated bonds and urea bonds may employ a block, random, graft or other structure.

The vinyl polymer or condensation polymer type alkaline soluble resin (a) having urea bonds which is suitably employed in the present invention may be obtained by copolymerization of the aforementioned polymerizable monomers represented by general formula [II] and another of the copolymerizable polymerizable monomer mentioned above. The copolymer obtained using the polymerizable monomers represented by general formula [II] in an amount of 10 to 80 parts by weight per 100 parts by weight of the monomers in total is even more preferably used in the present invention.

Further, at least one compound selected from the group comprising polymerizable maleimide, polymerizable (meth) acryl amide, polymerizable (meth)acrylate, and polymerizable (meth)acrylonitrile may be suitably employed as the component of the other copolymerizable polymerizable monomer.

Moreover, the photosensitive composition of the present invention may include two or more types of resin (A) which have different copolymer components. A variety of characteristics may be associated with resin (A)'s resistance to solvents depending on the copolymer composition. By combining these kinds of resins, it is possible to obtain even more superior properties.

For example, a positive working photosensitive planographic printing plate may be formed which employs a resin which uses at least one type of monomer selected from among the group comprising polymerizable maleimide, polymerizable (meth)acryl amides, and polymerizable (meth)acrylates as the polymerizable monomer which can be copolymerized with the polymerizable monomer represented by general formula [II], and the resin of the present invention which includes (meth)acrylonitrile and (meth) acryl amide as the copolymer components represented by general formula [II]. In this case, the planographic printing plate demonstrates excellent resistance to solvents such as diacetone alcohol which readily dissolve ordinary resins. Further, the coloring of the photosensitive layer upon baking (or burning) treatment is excellent, and press-life is further improved. In addition, this planographic printing plate also demonstrates other excellent properties including absence of the generation of scumming in the non-image area.

The weight ratio of the former resin and the latter resin is not particularly limited, but is ordinarily in the range of 80/20 to 20/80 (former resin/latter resin), and preferably in the range of 60/40 to 40/60.

The thus obtained copolymer preferably has a weight average molecular weight of over 2,000, with a number average molecular weight of over 1,000. It is even more preferable that the thus obtained copolymer has a weight average molecular weight in the range of 3,000 to 500,000, with a number average molecular weight in the range of 2,000 to 400,000.

Examples of solvents which may be employed when synthesizing this type of resin include ethylene dichloride, cyclohexanone, methyl ethyl ketone, acetone, methanol, ethanol, ethylene glycol monomethyl ether, ethylene glycol monoethyl glycol, 2-methoxyethyl acetate, 1-methoxy-2-propanol, 1-ethoxy-2-propanol, 1-methoxy-2-propyl acetate, 1-ethoxy-2-propyl acetate, N,N-dimethyl formamide, N,N-dimethyl acetoamide, dimethylsulfoxide, N-methyl-2-pyrolidone, toluene, ethyl acetate, methyl lactate, ethyl lactate, and the like. These solvents may be employed alone or in combinations of 2 or more.

Additionally, novolak resins having urea bonds in their side chains are also available as examples of a condensation polymer type alkaline soluble resin (A) which has urea bonds in its side chains and is suitably employed in the present invention's photosensitive composition.

Novolak resins having urea bonds in their side chains which are suitably employed in the present invention are preferably novolak resins which have the reaction product of a compound having a carbonyl group and an aromatic compound having urea bonds among its substituents as its fundamental skeleton.

Examples of compounds having a carbonyl group which are suitably employed in the present invention include aldehydes such as formaldehyde, acetoaldehyde, and phenyl aldehyde, and ketones such as acetone, methyl ethyl ketone, and acetophenone, and the like.

Further, examples of an aromatic compound having urea bonds among its substituents include phenol derivatives such as 2-(N'-phenyl ureido)phenol, 3-(N'-phenyl ureido)phenol, 4-(N'-phenyl ureido)phenol, 2-(N'-methyl ureido)phenol, 3-(N'-methyl ureido)phenol, 4-(N'-methyl ureido)phenol, and the like; and cresol derivatives such as 5-(N'-phenyl ureido)-o-cresol, 5-(N'-methyl ureido)-o-cresol, and the like.

These aromatic compounds having urea bonds may be used alone or in combinations of two or more in the resin synthesis.

Further, as necessary, an aromatic compound not having urea bonds in its substituent groups may also be employed in the synthesis of a novolak resin having urea bonds in its side chains. Examples of this kind of compound include compounds having phenolic hydroxyl groups such as phenol, p-cresol, m-cresol, p-octyl phenol, resorcinol, pyrogallol, bisphenol A, and the like.

The novolak resin having urea bonds in its side chains employed in the present invention is synthesized by adding a known acid catalyst to a compound having a carbonyl group and the aforementioned aromatic compound, and heating. The resin preferably has a number average molecular weight in the range of 300 to 10,000, and a weight average molecular weight in the range of 500 to 100,000.

Resin (A) having urea bonds in its side chains which is employed in the present invention's photosensitive composition may be used alone or in combination with another resin. Resin (A) is preferably included in the photosensitive composition in the amount of 5 to 95%.

Any one of the photosensitive compounds (B) of a variety of structures commonly used may be employed in the present invention's photosensitive composition. However, where the photosensitive composition is a positive working photosensitive composition, it is preferable that photosensitive compound (B) be an o-naphthoquinone diazido compound. Where the photosensitive composition is a negative working photosensitive composition, it is preferable that photosensitive compound (B) be a diazo compound. Further, a photosensitive compound having urea bonds in its side chains may also be employed as photosensitive compound (B).

o-naphthoquinone diazido sulfonic ester of an acryl type resin which includes the structural units represented by general formula [I], is preferably used as the photosensitive compound having urea bonds in its side chains which is employed in the present invention's positive working photosensitive composition. The structural units represented by general formula [I] preferably comprise 10 to 100% of the resin by weight. Further, while the property of resistance to solvents improves as the rate of o-naphthoquinone diazido sulfonic esterification increases, solubility in the solvent which is employed when coating the photosensitive composition decreases. Accordingly, it is preferable that the rate of esterification be in the range of 1 to 80%. These types of o-naphthoquinone diazido sulfonic esters are readily synthesized by means of the known synthesis methods mentioned above.

Further, when a photosensitive compound having urea bonds in its side chains which is applicable in the present invention is used along with the present invention's binder resin (A) which has urea bonds in its side chains, a photosensitive composition is obtained which has even more superior resistance to solvents. When o-naphthoquinone diazido sulfonic ester, the aforementioned binder resin having urea bonds in its side chains, is employed, the photosensitive composition obtained has particularly excellent resistance to solvents.

The present invention's photosensitive composition may be employed as a positive or a negative working planographic printing plates by coating the composition onto an aluminum support.

In the case of a positive working planographic printing plate, a variety of additives may be added according to the desired objective. For example, a surfactant may be added to improve coatability, a plasticizer may be added to improve the properties of the coating layer, an oleophilicitizer having a hydrophobic group may be added to increase the ink receptivity of the printing area, cyclic acid anhydrides may be added to increase sensitivity, a print-out agent may be added for obtaining a visible image immediately following light exposure, and dyes may be added as image coloring agents. In addition to these, other fillers may be added as well.

In the case of a negative working planographic printing plate, an organic high molecular binding agent may also be employed in addition to the negative working photosensitive compound and the alkaline soluble resin having urea bonds. Examples of this kind of organic high molecular binding agent include acryl resin, polyamide resin, polyurethane resin, phenoxy resin, epoxy resin, polyacetal resin, polystyrene resin, novolak resin and the like. Further, known additives such as heat polymerization inhibitors, dyes, surfactants, plasticizers, or stabilizers may be added to improve properties.

Examples of surfactants include the fluorine type surfactants disclosed in Japanese Patent Application, First Publication, No. Sho 62-36657; and Japanese Patent Application, First Publication, No. Sho 62-226143. Examples of plasticizers include diethylphtalate, dibutylphtalate, dioctylphtalate, tributyl phosphate, trioctyl phosphate, tricresyl phosphate, tri(2-chloroethyl) phosphate, tributyl citrate and the like.

Examples of the oleophilicitizer include novolak resins having hydrophobic groups such as p-octyl phenol novolak, p-t-butyl phenol novolak and the like. As disclosed in U.S. Pat. No. 4,115,128, examples of cyclic acid anhydrides include phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, $\alpha$-phenylmaleic anhydride, succinic anhydride, pyromellitic anhydride, and the like. By including these cyclic acid anhydrides in the amount of 1 to 15% by weight in the photosensitive composition, the sensitivity may be increased three-fold.

A combination of a photosensitive compound which releases acid upon exposure to light and an organic dye which can form a salt may be cited as a representative example of a print-out agent for obtaining a visible image immediately following exposure to light. Specifically, the combination of o-naphthoquinone diazido-4-sulfonyl halogenide and an organic dye which can form a salt disclosed in Japanese Patent Application, First Publication, No. Sho 50-36223; and Japanese Patent Application, First Publication, No. Sho 53-8128; and the combination of a trihalomethyl compound and an organic dye which can form a salt disclosed in Japanese Patent Application, First Publication, No. Sho 53-36223, Japanese Patent Application, First Publication, No Sho 54-74728; Japanese Patent Application, First Publication, No. Sho 60-3626; Japanese Patent Application, First Publication, No. Sho 61-143748; Japanese Patent Application, First Publication, No. Sho 61-151644; and Japanese Patent Application, First Publication, No. Sho 63-58440 may be cited.

Other dyes in addition to the salt forming organic dye mentioned above may be employed as the image coloring agent. For example, oil soluble dyes and basic dyes, including salt forming organic dyes, may be mentioned as examples of suitable coloring agents. Specific examples include oil yellow #101, oil yellow #130, oil pink #312, oil green BG, oil blue BOS, oil blue #603, oil black BY, oil black BS, oil black T-505 (aforementioned all manufactured by Orient Chemical Corp.), Victoria Pure Blue, Crystal Violet (CI42555), Methyl Violet (CI42535), Rhodamine B (CI45170B), Malachite Green (CI42000), Methylene Blue (CI52015) and the like.

Further, known stabilizing agents include phosphoric acid, phosphorous acid, oxalic acid, tartaric acid, malic acid, citric acid, dipicolinic acid, polyacrylic acid, benzene sulfonic acid, toluene sulfonic acid, and the like.

The amount added of these various additives differs according to the objective, but, in general, is preferably in the range of 0 to 30% by weight with respect to the solid component of the photosensitive composition.

The above photosensitive composition may be dissolved in a variety of solvents and coated onto a support as necessary. Examples of employable solvents include halogen type solvents such as methylene chloride, chloroform, dichloroethane, trichloroethane, trichloroethylene, monochlorobenzene, dichlorobenzene, carbon tetrachloride, and the like; aliphatic, alicyclic, or aromatic hydrocarbons such as hexane, heptane, cyclohexane, benzene, toulene, xylene, and the like; ether type solvents such as tetrahydrofuran, dioxane, diethyl ether, and the like; ester type solvents such as methyl acetate, butyl acetate, ethyl acetate, methyl cellosolve acetate, ethyl cellosolve acetate, and the like; ketone type solvents such as acetone, methyl ethyl ketone, methyl isobutyl ketone, cyclohexanone, and the like; alcohol type solvents such as methanol, ethanol, butanol, benzyl alcohol, diacetone alcohol, methyl cellosolve, ethyl cellosolve, cyclohexanol, and the like; nitrogen-containing solvents such as acetonitrile, N,N-dimethyl formamide, N,N-dimethyl acetoamide, N-methyl pyrolidone, and the like; and dimethyl sulfoxides. These solvents may be employed alone, or in combinations of two or more. Additionally, depending on the situation, they may also be employed in a mixture with water. These solvents may be employed alone or in combinations of two or more, or may be employed in a mixture with water depending on the circumstances.

The thus produced photosensitive composition may be coated to a support by means of various known coating methods including dip coating, curtain coating, roll coating, spray coating, whirler coating, spinner coating, air knife coating, doctor knife coating, or the like.

Examples of the support include aluminum, zinc, copper, stainless steel, iron or other metallic plates; plastic films such as polyethylene terephtalate, polycarbonate, polyvinyl acetal, polyethylene and the like; paper coated with a melted synthetic resin or coated with a synthetic resin solution; a composite material wherein vacuum deposition or laminating is employed to provide a metallic layer to a plastic film; as well as a variety of other materials which can be employed as supports for printing plates.

Further, in the case of a support having a metallic surface, and in particular an aluminum surface, it is preferable to carry out a surface treatment such as graining, anodic oxidation, and hydrophilization. The amount of the photosensitive composition coated is typically about 0.5 to 5 g/m$^2$ dry weight.

Following coating, drying is carried out by a known method to obtain a photosensitive planographic printing plate in which a photosensitive layer is provided on top of a support.

The thus obtained photosensitive planographic printing plate may be used in the known methods. For example, a coating layer may be adhered to the photosensitive planographic printing plate, exposed to light under a super high pressure mercury lamp, metal halide lamp or the like, developed using an alkaline aqueous solution such as sodium metasilicate, potassium metasilicate, sodium phosphate, or sodium hydroxide, and used as a printing plate.

A planographic printing plate obtained in this way which undergoes a baking treatment (also known as burning treatment) following light exposure and development has even more improved press-life and a reduced generation of scumming or the like in the plate's non-image area as compared to an identically obtained planographic printing plate which does not undergo a burning treatment.

(EXAMPLES)

The present invention will now be explained in greater detail using examples. However, the present invention is in no way limited to the following examples, but may include variations and the like, so long as these remain within the gist of the invention as explained herein.

Formulation of Compound 1

Methacryloyloxyethylisocyanate and 4-aminophenol were added to dioxane solvent, and stirred for 2 hours to obtain 2-(N'-(4-hydroxyphenyl)ureido)ethylmethacrylate (hereinafter referred to simply as "Compound 1").

Formulation of Compounds 2 through 7

The aforementioned Compound 1 and another monomer having polymerizable unsaturated bonds were polymerized in the ratios shown in Tables 1 and 2, to obtain the alkaline soluble resins (hereinafter, referred to simply as "Compounds 2 through 7") having urea bonds in their side chains which are employed in the present invention.

Formulation of Compound 8

Phenyl isocyanate and 4-aminophenol were added to dioxane solvent, and stirred for 2 hours to obtain 4-(N'-phenylureido)phenol (hereinafter, referred to simply as "Compound 8").

Formulation of Compound 9

While stirring 4-(N'-phenylureido)phenol), an aqueous solution of formaldehyde, and oxalic acid, the mixture was heated to 100° C., to obtain the alkaline soluble resin hereinafter referred to simply as "Compound 9") having urea bonds in its side chains, which is employed in the present invention and has as its principle component a resin of the following chemical structure. The obtained resin has a weight average molecular weight of 2,000.

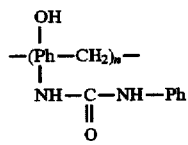

(Wherein, n is 1 through 15, the Ph inside the parenthesis is a benzene ring ($C_6H_2$), and the Ph bound to NH is a phenyl group.)

Formulation of Compound 10

50 parts by weight of Compound 1, 20 parts by weight of methyl methacrylate, and 30 parts by weight of 2-hydroxyethyl methacrylate were introduced into a solution of N,N-dimethylacetoamide. AIBN was added to this as a catalyst, and the mixture was stirred for 6 hours at 80° C. The mixture was then poured into water, and the precipitate formed was filtered and dried, to obtain an alkaline soluble resin (hereinafter, referred to simply as "Compound 10") having urea bonds in its side chains which is employed in present invention. The obtained resin had a weight average molecular weight of 100,000, with a yield of 95%.

Formulation of Compound 11

50 parts by weight of Compound 1, 20 parts by weight of methyl methacrylate, and 30 parts by weight of 2-hydroxyethyl methacrylate were introduced into a solution of N,N-dimethylacetoamide. AIBN was added to this as a catalyst, and the mixture was stirred for 6 hours at 80° C. After cooling the mixture to 25° C., 35.7 parts by weight of methacryloyloxyethylisocyanate (equivalent to the molar weight of 2-hydroxyethyl methacrylate) was added to the mixture as a sufficient flow of dry air was blown into the reaction solution. The mixture was then stirred an additional 5 hours at room temperature. The reaction solution was poured into water, and the precipitate formed was filtered and dried to obtain the alkaline soluble resin (hereinafter, referred to simply as "Compound 11") having urea bonds in its side chains which is employed in the present invention.

The obtained resin had a weight average molecular weight of 120,000, with a yield of 95%.

TABLE 1

| Compound | Components of Copolymer | Composition Ratio (weight %) | Weight Average Molecular Weight |
|---|---|---|---|
| 2 | Compound 1 | 72 | 16,000 |
|   | N-phenyl maleimide | 28 |  |
| 3 | Compound 1 | 63 | 45,000 |
|   | acrylonitrile | 23 |  |
|   | methacrylamide | 14 |  |
| 4 | Compound 1 | 52 | 85,000 |
|   | N-phenyl maleimide | 34 |  |
|   | methacrylamide | 14 |  |

TABLE 2

| Compound | Components of Copolymer | Composition Ratio (mol %) | Weight Average Molecular Weight |
|---|---|---|---|
| 5 | Compound 1 | 11 | 74,000 |
|   | acrylonitrile | 65 |  |
|   | methacrylamide | 10 |  |
|   | methyl methacrylate | 13 |  |
| 6 | Compound 1 | 11 | 49,000 |
|   | acrylonitrile | 73 |  |
|   | methacrylamide | 10 |  |
|   | N-phenyl maleimide | 6 |  |
| 7 | Compound 1 | 10 | 54,000 |
|   | acrylonitrile | 70 |  |
|   | methacrylamide | 10 |  |
|   | methacrylate | 10 |  |

Next, photosensitive solutions (photosensitive compositions) of the composition ratio shown in Table 3 were formulated for Examples 1 through 5 and Comparative Example 1; photosensitive solutions (photosensitive compositions) of the composition ratios shown in Tables 4 were formulated for Examples 6 and 7; a photosensitive solution (photosensitive compositions) of the composition ratio shown in Table 5 was formulated for Example 8; and a photosensitive solution (photosensitive compositions) of the composition ratio shown in Table 6 was formulated for Example 9.

TABLE 3

Coating Solution of Positive Working Photosensitive Composition

| Coating Combination of Photosensitive Compositions | units: g |
|---|---|
| ester compound of 1,2-naphthoquinone diazido-5-sulfonyl chloride and 2,3,4-trihydroxybenzophenone (see note 1) | 0.20 |
| cresol-formaldehyde resin (see note 2) | 0.15 |
| 2-(4-methoxynaphtyl)-4,6-bis(trichloromethyl)-s-triazine | 0.01 |
| Victoria Pure Blue - BOH (see note 3) | 0.01 |
| resin A of above compounds (2, 3, 5, 6 or 8) | 0.60 |
| methyl ethyl ketone | 5.00 |
| methyl cellosolve | 5.00 | note 1: 90% rate of esterification
note 2: A mixture of 100 g of m-cresol, 66.8 g of p-cresol and 36.0 g of phenol, 105 g of a 37% aqueous formaldehyde solution, and 2.5 g of oxalic acid was heated, with the mixture stirred at 105° C. for 3 hours. The temperature was raised to 175° C. and the water was evaporated. The monomer remaining was evaporated at 200° C./100 mmHg. The weight average molecular weight of the resin obtained by the above method was 4,000.
note 3: Basic oil soluble dye produced by Hodogaya Chemical Co., Ltd.

TABLE 4

Coating Solution of Positive Working Photosensitive Composition (2)

| Coating Combination of Photosensitive Composition | units: g |
|---|---|
| ester compound of 1,2-naphthoquinonediazido-5-sulfonyl chloride and 2,3,4-trihydroxybenzophenone (see note 1) | 0.18 |
| Crystal Violet | 0.01 |
| 2-(4-methoxynaphtyl)-4,6-bis(trichloromethyl)-s-triazine | 0.01 |
| resin A of above compounds (5 only, and 4 and 5) | 0.80 |
| methyl ethyl ketone | 4.00 |
| methyl cellosolve | 6.00 | note 1: 66% rate of esterification

TABLE 5

Coating Solution of Negative Working Photosensitive Composition (1)

| Coating Combination of Photosensitive Composition | units: g |
|---|---|
| hexafluorophosphate of the condensate of p-diazodiphenylamine and formaldehyde | 7.5 |
| resin A of above Compound 10 | 65.0 |
| Victoria Pure Blue - BOH (see note 1) | 1.0 |
| ethylene glycol monomethyl ether | 500 |
| methyl ethyl ketone | 300 |
| methanol | 200 | note 1: Basic oil soluble dye manufactured by Hodogaya Chemical Co. Ltd.

TABLE 6

Coating Solution of Negative Working Photosensitive Composition (2)

| Coating Combination of Photosensitive Composition | units: g |
|---|---|
| hexafluorophosphate of the condensate of p-diazodiphenylamine and formaldehyde | 5.0 |
| resin D of above Compound 11 | 50.0 |
| dipentaerythritol hexacrylate | 15.0 |
| 2-(4-methoxynaphtyl)-4,6-bis(trichloromethyl)-s-triazine | 2.5 |
| Victoria Pure Blue - BOH (see note 1) | 1.0 |
| ethylene glycol monomethyl ether | 500 |
| methyl ethyl ketone | 300 |
| methanol | 200 | note 1: Basic oil soluble dye manufactured by Hodogaya Chemical Co., Ltd.

(Examples 1 through 9)

A 0.24 mm thick aluminum plate was degreased in sodium hydroxide, and electrolytically grained in a 20% hydrochloric acid solution to obtain a grained plate of Arithmetical Mean Deviation of the Profile (Ra) of 0.6 μm. Next, anodic oxidation was carried out at a current density of 2A/dm$^2$ in a 20% sulfuric acid solution, to form a 2.7 g/m$^2$ oxide film. This was then washed and dried to obtain the aluminum support. The thus obtained aluminum support was coated with the aforementioned photosensitive solutions (photosensitive compositions) using a roll coater. The aluminum support was then dried for 3 minutes at 100° C., to obtain a photosensitive planographic printing plate. The thickness of the dried coating layer was 2.0 g/m$^2$.

An image film was affixed to each of the obtained photosensitive planographic printing plates. Light exposure was then carried out from a distance of 1 m using a 3 kW metal halide lamp. Processor PD-912, manufactured by DAINIPPON SCREEN MFG. CO.,LTD, was then employed to carry out developing for 12 seconds at 30° C. using a 9 part diluted solution of PD-1 developer (manufactured by Polychrome Japan Corporation, available through Dainippon Ink & Chemicals, Inc.) for the positive working photosensitive planographic printing plates (Examples 1 through 7), or for 19 seconds at 30° C. using a 4 part diluted solution of ND-1 developer (manufactured by Polychrome Japan Corporation, available through Dainippon Ink & Chemicals, Inc.) for the negative working photosensitive planographic printing plates (Examples 8 and 9). The thus formed planographic printing plates were then evaluated for resistance to solvents and press-life.

(Examples 1 through 5)

The results of evaluations of Examples 1 through 5 which employed the present invention's resin having urea bonds in its side chains in a positive working planographic printing plate are shown in Table 7.

Resistance to solvents was evaluated by soaking planographic printing plates which had been exposed to light in the aforementioned device for 30 minutes in various solvents, and then evaluating the degree of corrosion of the photosensitive layer.

Further, press-life was evaluated as follows. Namely, a planographic printing plate was affixed to ROLAND Favorit printing machine, and printing was carried out using the UV ink DICURE Scepter black (manufactured by Dainippon Ink & Chemicals, Inc.) and 100 part diluted solutions of fountain solution NA-108W (manufactured by Dainippon Ink & Chemicals, Inc.). An evaluation of press-life was then made from the final number of printed pages obtained with accurate printing.

TABLE 7

| | Resins A in Table 3 | Resistance to Solvents | | | Press-life (number of pages printed) using UV ink |
|---|---|---|---|---|---|
| | | A | B | C | |
| Example 1 | Compound 2 | Δ | O | X | 50,000 |
| Example 2 | Compound 3 | O | O | Δ | 70,000 |
| Example 3 | Compound 6 | O | O | O | 75,000 |
| Example 4 | Compound 7 | O | O | O | 70,000 |
| Example 5 | Compound 9 | O | O | X | 40,000 |
| Comparative Example 1 | Comparative Compound 1 | X | Δ | X | 30,000 |

Columns A, B, and C under the heading "Resistance to Solvents" above indicate the following mixed solvents.

A: light oil (60%)+butyl cellosolve (40%)

B: xylene (30%)+light oil (50%)+butyl cellosolve (20%)

C: 3-methyl-3-methoxybutanol (50%)+ethanol (50%)

The evaluation standards were as follows.

O: no corrosion,

Δ: slight corrosion present,

X: total corrosion (Formulation of Comparative Compound 1)

350 g of hydroquinone was dissolved in 2.5 kg of acetone and 500 ml of pyridine. After cooling to 0° C., 313.5 g of methacryloyl chloride was added dropwise, with the reaction temperature maintained at 0° to 5° C. Stirring was then carried out for 3 hours at the same temperature. After stirring for one more hour at room temperature, the acetone was evaporated. Water was then added, and hydrochloric acid was used to adjust the solution to an acidic pH (pH 4), with ether extraction then performed. After washing this ether layer with a 5% aqueous solution of sodium hydrogencarbonate, the solution was then washed with water and dried (anhydrous sodium carbonate). The ether was then evaporated out, with a white solid being obtained. This was recrystallized from water, to obtain 420 g of colorless, needle crystals of hydroquinone monomethacrylate having a melting point of 120.5° to 121.5° C.

A copolymer was synthesized under the same conditions as those employed in the synthesis of Compound 2, with the exception that hydroquinone monomethacrylate was employed in place of the monomer of Compound 1 employed in Compound 2. The weight average molecular weight of this copolymer was 18,000.

(Comparative Example 1)

Planographic printing plates were formed by the same method as that employed in Example 1, with the resin of Comparative Compound 1 being employed in place of the resin of Compound 2 in the compositions shown in Table 3. The results of comparisons of resistance to solvents and press-life of these planographic printing plates are shown together in Table 7.

These results indicate that the planographic printing plates of the present invention offer superior resistance to solvents and an excellent press-life as compared to the planographic printing plates of Comparative Example 1. Thus, it is clear that a resin having urea bonds in its side chains improves the resin's resistance to solvents. Further, the copolymer composition of the acryl type resin (vinyl polymer type resin) employed was varied in Examples 1 through 4, while Example 5 employed a novolak type resin (condensation polymer type resin). However, in all of these cases, the resins demonstrated excellent resistance to solvents and superior press-life. While not disclosed in the Examples, compounds in which the end group is a hydroxyl group have excellent press-life. In addition, developing characteristics were evaluated based on whether or not the image could be formed by means of the above described developing process, whether or not the half-tone of a grey scale turned brown or black, and on other factors. The printing characteristics of Examples 1 through 5 and Comparative Example 1 were found to be excellent.

Additionally, employing methacrylamide as a copolymer component also improves resistance to solvents and press-life.

Further, the planographic printing plates in Examples 3 and 4 which employed a large amount of acrylonitrile also had excellent characteristics with respect to resistance to solvents and press-life. Examples 2 through 4 which employed resins containing acrylonitrile (compounds 3, 6, and 7) demonstrated particularly excellent press-life. In particular, the planographic printing plates of Examples 3 and 4, wherein the proportion of acrylonitrile contained in the resins of compounds 6 and 7 exceeds 60 molar percent, also demonstrated superior resistance to a mixed solvent of 3-methyl-3-methoxybutanol (50%) and ethanol (50%).

(Examples 6 and 7)

With the exception that the photosensitive solutions (photosensitive compositions) shown Table 4 were employed, photosensitive planographic printing plates were formed in the same manner as in Examples 1 through 5, and were evaluated on resistance to solvents and press-life. Resistance to solvents was evaluated by soaking planographic printing plates which had been exposed to light in the above device for 30 minutes in a mixed solvent of 3-methyl-3-methoxybutanol (50%) and ethanol (50%) or in diacetone alcohol, and evaluating the degree of corrosion of the photosensitive layer. An evaluation of press-life was carried out as follows. The planographic printing plates were affixed to a ROLAND Favorit printing machine, and printing was carried out with a 100 part diluted solutions of the UV ink DICURE Scepter black (manufactured by Dainippon Ink & Chemicals, Inc.) and fountain solution NA-108W (manufactured by Dainippon ink and Chemicals, Inc.). An evaluation of press-life was then made from the final number of printed pages obtained having accurate printing. These results are shown in Table 8.

TABLE 8

| Resins A in Table 4 | Resistance to solvents (see note 1) | | Burning scumming (see note 2) |
|---|---|---|---|
| | a | b | |
| Ex. 6 | Compound 5 | ○ | △ | ○ |
| Ex. 7 | Compound 5 (50%) Compound 4 (40%) | ○ | ○ | ○ | note 1: The evaluation of resistance to solvents was made using solvent a, a mixed solvent of 3-methyl-3-methoxybutanol (50%) and ethanol (50%), and solvent b, diacetone alcohol. The evaluation standards were as follows. ○: excellent △: good X: poor
note 2: X designates the case where scumming occurred in the non-image area when printing was carried out using a burning treatment. ○ designates the case were no scumming was generated.

Further, Examples 6 and 7, in which a resin (Compound 5) which contains acrylonitrile in excess of 60 molar percent and methacrylamide is employed, demonstrated a strong resistance to solvent a. Additionally, Example 7, which employed the resin of Compound 5 and the resin of Compound 4 in a ratio of 50% each, showed strong resistance to solvents a and b, as well as superior resistance to solvents as compared to Example 6, which employed only the resin of Compound 5 and demonstrated a strong resistance to solvent a only. Accordingly, by adding a resin of a compound such as Compound 4, which demonstrates resistance to a specific solvent, to the resin of Compound 5 which includes acrylonitrile in excess of 60 molar percent and methacrylamide, a positive working planographic printing plate which demonstrates even more superior resistance to solvents can be obtained.

Further, in Examples 6 and 7 which employ the binder resins of the present invention, scumming is not generated in the non-image area even in the case where printing is carried out by a burning treatment, thus making it possible to obtain excellent printing.

(Examples 8 and 9)

The results of an evaluation of Examples 8 and 9 which employed the present invention's resins A and D which have urea bonds in their side chains in a negative working photosensitive planographic printing plate are as shown in Table 9 below.

Resistance to solvents was evaluated by soaking planographic printing plates which had been exposed to light in the above device in butylcellosolve for one hour, and evaluating the degree of corrosion of the photosensitive layer. Further, press-life was evaluated as follows. The planographic printing plates were affixed to a ROLAND Favorit printing machine, and printing was carried out with the UV ink DICURE Scepter black (manufactured by Dainippon Ink & Chemicals, Inc.), and 100 part diluted solutions of fountain solution NA-108W (manufactured by Dainippon Ink and Chemicals, Inc.). Evaluation was then made based on the final number of printed pages obtained having accurate printing.

TABLE 9

| | Resins A in Table 5 | Resins D in Table 6 | Resistance to Solvents (see note 1) | Press-life |
|---|---|---|---|---|
| Example 8 | Compound 10 | — | Δ | 250,000 |
| Example 9 | — | Compound 11 | ○ | 300,000 | note 1: Evaluations were carried out after soaking for 1 hour in butylcellosolve. The evaluation standards were as follows. ○: no corrosion Δ: slight corrosion X: clear signs of corrosion remaining Example 8 showed excellent resistance to solvents and superior press-life. Example 9 also showed excelled resistance to solvents and superior press-life. A negative working photosensitive planographic printing plate (Example 8) in which the resin of the present invention which has urea bonds in its side chains is used together with a photosensitive diazonium compound demonstrated excellent resistant to solvents and was excellent in regard to press-life, stability over time, and safe-light-resistance. Further, when the resin of the present invention which has urea bonds in its side chains also has ethylenic unsaturated groups (Example 9), even more superior resistance to solvents and excellent press-life can be obtained by combining the resin with a photosensitive diazonium compound, photopolymerization initiator, or a monomer having an ethylenic unsaturated group. In this way, then, a highly sensitive negative working photosensitive planographic printing plate can be obtained. Furthermore, the ink receptivity of Example 8 and 9 were excellent.

The present invention has been described in detail herein with reference to Examples 1 to 9; additionally, the present invention encompasses the following embodiments for example.

Namely, the present invention relates to:

1. A photosensitive admixture composition comprising a resin (A) having urea bonds in its side chains and a photosensitive compound (B), wherein the resin (A) contains at least one resin selected from the group consisting of a vinyl polymer type resin and condensation polymer type resin.

2. A photosensitive composition according to item 1, wherein the resin (A) having urea bonds in its side chains is a vinyl polymer and/or a condensation polymer type alkaline soluble resin (a) which has urea bonds in its side chains.

3. A photosensitive composition according to item 1, wherein the resin (A) having urea bonds in its side chains is a vinyl polymer type alkaline soluble resin (a).

4. A photosensitive composition according to item 3, wherein the vinyl polymer type alkaline soluble resin (a) which has urea bonds in its side chains contains (meth) acrylonitrile.

5. A photosensitive composition according to item 3, wherein the vinyl polymer type alkaline soluble resin (a) which has urea bonds in its side chains contains (meth) acrylamide.

6. A photosensitive composition according to item 3, wherein the vinyl polymer type alkaline soluble resin (a) which has urea bonds in its side chains contains (meth) acrylonitrile and (meth)acrylamide.

7. A photosensitive composition according to item 3, wherein the vinyl polymer type alkaline soluble resin (a) which has urea bonds in its side chains contains (meth) acrylonitrile in an amount in excess of 60 molar percent and not more than 90 molar percent, and contains (meth) acrylamide.

8. A photosensitive composition according to item 3 wherein the vinyl polymer type alkaline soluble resin (a) which has urea bonds in its side chains contains (meth) acrylonitrile in an amount in excess of 60 molar percent and not more than 90 molar percent, and contains (meth) acrylamide in an amount of 5 to 20 molar percent.

9. A photosensitive composition according to one of items 1, 2, 3, 4, 5, 6, 7, and 8, which is employed as a positive working composition, wherein the photosensitive compound (B) is o-naphthoquinone diazido compound.

10. A positive working photosensitive admixture composition which contains a vinyl polymer or condensation polymer type alkaline soluble resin (A) having urea bonds in its side chains and an o-naphthoquinone diazido compound (B) as essential components.

11. A positive working photosensitive composition which contains a vinyl polymer or condensation polymer type alkaline soluble resin (a) having urea bonds in its side chains, an o-naphthoquinone diazido compound (B), and a novolak resin (C) which is different from resin (a) and compound (B), as essential components.

12. A positive working photosensitive composition for use in a lithographic printing plate containing a vinyl polymer or condensation polymer type alkaline soluble resin having urea bonds in its side chains, an o-naphthoquinone diazido sulfonic ester (b), and a novolak resin (C) which is different from (a) and (b), as essential components, wherein ester (b) is employed in the amount of 10 to 50 parts per 100 parts by weight of a binder resin consisting of resin (a) and resin (C), and resin (a) is employed in the amount of 5 to 95 parts per 100 parts by weight of resin (a) and resin (C).

13. A positive working photosensitive composition according to item 9, wherein the resin (A) having urea bonds in its side chains is an alkaline soluble acryl type resin containing the structural units represented by the following general formulas [Ia]~[Ic].

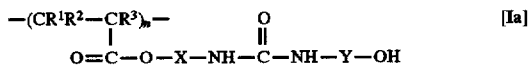

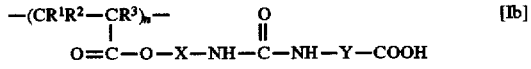

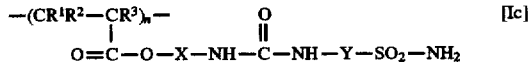

[Wherein, $R^1$ and $R^2$ respectively represent a hydrogen atom halogen atom, alkyl group, aryl group, carboxyl group, or a salt thereof; $R^3$ represents a hydrogen atom, halogen atom alkyl group, or aryl group; X indicates a bivalent linking group; and Y represents a bivalent aromatic group which may have substituents.]

14. A positive working photosensitive composition according to item 9, wherein the resin (A) having urea bonds in its side chains is an alkaline soluble acryl type resin containing the structural units represented by the above general formula [Ia].

15. A positive working photosensitive composition according to item 14, wherein the vinyl polymer or condensation polymer type resin (A) having urea bonds in its side chains contains the structural units represented by the above general formula [Ia] in the amount of 10 to 80 parts per 100 parts by weight of the resin.

16. A positive working photosensitive composition according to item 9, wherein the vinyl polymer or condensation polymer type resin (A) having urea bonds in its side chains is an acryl type resin in which polymerizable monomers represented by the following general formulas [IIa]–[IIc] are polymerized as essential components.

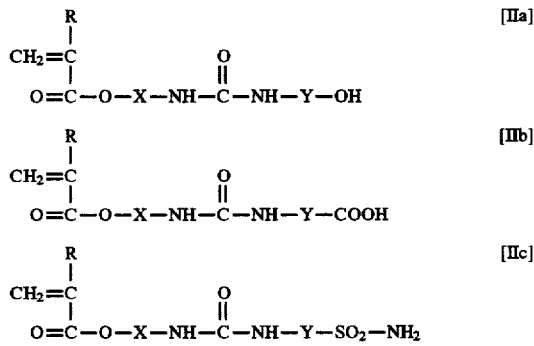

[Wherein, R represents a hydrogen atom, halogen atom, alkyl group, or aryl group; X indicates a bivalent linking group; and Y represents a bivalent aromatic group which may have substituents.]

17. A positive working photosensitive composition according to item 9, wherein the vinyl polymer or condensation polymer type resin (A) having urea bonds in its side chains is an acryl type resin in which polymerizable monomers represented by the above general formula [IIa] are polymerized as essential components.

18. A positive working photosensitive composition according to item 17, wherein the vinyl polymer or condensation polymer type resin (A) having urea bonds in its side chains is a copolymer of a polymerizable monomer represented by the above general formula [IIa] and a different copolymerizable polymerizable monomer, the copolymer being obtained by employing the polymerizable monomer represented by general formula [IIa] in the amount of 10 to 80 parts per 100 parts by weight of the copolymer.

19. A positive working photosensitive composition according to item 18, wherein the resin (A) contains at least one monomer selected from the group consisting of polymerizable maleimides, polymerizable (meth)acrylamides, polymerizable (meth)acrylates, and polymerizable (meth)acrylonitriles, as the copolymerizable polymerizable monomer.

20. A photosensitive composition according to item 2, which contains at least two or more resins (A) in which the copolymer composition differs.

21. A positive photosensitive planographic printing plate comprising a resin obtained by employing a polymerizable monomer represented by the above general formulas [IIa]–[IIc] and at least one monomer selected from the group consisting of polymerizable maleimides, polymerizable (meth)acrylamides, and polymerizable (meth)acrylates as polymerizable monomers; and an alkaline soluble vinyl polymer type resin having urea bonds in its side chains which contains (meth)acrylonitrile in an amount in excess of 60 molar percent and not more than 90 molar percent and contains (meth)acrylamide in an amount of 5 to 20 molar percent.

22. A photosensitive composition according to item 9, wherein the vinyl polymer or condensation polymer resin (A) having urea bonds in its side chains is a novolak type resin.

23. A positive working photosensitive planographic printing plate, wherein a photosensitive layer is laminated to a metallic support layer, the photosensitive layer containing a vinyl polymer or condensation polymer type resin (A) having urea bonds in its side chains and an o-naphthoquinone diazido sulfonic ester (B) as essential components.

24. A negative working photosensitive planographic printing plate, wherein a photosensitive layer is laminated to a metallic support layer, the photosensitive layer containing a vinyl polymer or condensation polymer type resin (A) having urea bonds in its side chains and a negative working photosensitive compound as essential components.

25. A negative working photosensitive planographic printing plate according to item 24, wherein the negative working photosensitive compound is photosensitive diazonium compound.

26. A negative working photosensitive planographic printing plate according to item 24, wherein the vinyl polymer or condensation polymer type resin (A) having urea bonds in its side chains is a resin (D) having the structure represented by general formula [Ia] and having ethylenic unsaturated bonds.

27. A negative working photosensitive planographic printing plate according to item 26, wherein the negative working photosensitive compound combines a photosensitive diazonium compound, photopolymerizable initiator, and a monomer or oligomer having ethylenic unsaturated bonds; the monomer or oligomer being other than resin (D).

28. A photosensitive composition according to item 1, wherein the resin (A) having urea bonds in its side chains is at least one alkaline soluble resin (a) selected from the group consisting of a vinyl polymer type resin and a condensation polymer type resin, the resin (a) having urea bonds and one group selected from the group consisting of hydroxyl group and sulfonamide group in its side chains.

29. A composition according to item 13, wherein the acryl type resin is an acryl type resin in which Y in the above general formulas [Ia] through [Ic] is a 1,4-phenylene group which may have substituents.

30. A composition according to item 13, wherein the acryl type resin is an acryl type resin in which Y in the above general formulas [Ia] through [Ic] is a 1,4-phenylene group which does not have substituents.

31. A composition according to item 13, wherein the acryl type resin is an acryl type resin containing the structural units represented by general formula [Ia] and/or by general formula [Ic] from among the polymerizable monomers represented by general formulas [Ia] through [Ic].

32. A composition according to item 16, wherein the acryl type resin contains as an essential component a polymerizable monomer in which Y in the above general formulas [IIa] through [IIc] is a 1,4-phenylene group which may have substituents.

33. A composition according to item 16, wherein the acryl type resin contains as an essential component a polymerizable monomer in which Y in the above general formulas [IIa] through [IIc] is a 1,4-phenylene group which does not have substituents.

34. A composition according to item 16 wherein the acryl type resin is an acryl resin in which the polymerizable monomer represent by general formula [IIa] and/or by general formula [IIc] is polymerized as an essential component.

What is claimed:

1. A photosensitive composition, which is an admixture comprising;

a resin (A) having urea bonds in its side chains; and a photosensitive compound (B);

wherein the resin (A) contains at least one alkaline soluble resin (a) selected from the group consisting of a vinyl polymer resin and a condensation polymer resin, the resin (a) having in its side chains urea bonds and a benzene ring to which a functional group selected from the group consisting of hydroxyl group and sulfonamide group is bonded.

2. A photosensitive composition according to claim 1, wherein the resin (A) containing said at least one alkaline soluble resin (a) is a copolymer comprising an ethylenic unsaturated monomer having urea bonds in its side chains and a different copolymerizable polymerizable monomer as its copolymer units;

wherein the resin (A) having urea bonds in its side chains is a vinyl polymer alkaline soluble resin comprising the ethylenic unsaturated monomer in the amount of 10 to 80 parts per 100 parts by weight of the copolymer.

3. A photosensitive composition according to claim 1, wherein the resin (A) containing said at least one alkaline soluble resin (a) is a vinyl polymer alkaline soluble resin containing as copolymer units an ethylenic unsaturated monomer having urea bonds in its side chains, (meth)acrylonitrile, and (meth)acrylamide.

4. A photosensitive composition according to claim 1, wherein the resin (A) containing said at least one alkaline soluble resin (a) is a vinyl polymer alkaline soluble resin containing urea bonds and polymerizable ethylenic unsaturated double bonds in its side chains.

5. A photosensitive composition according to claim 1, wherein the resin (A) containing said at least one alkaline soluble resin (a) is a resin mixture of at least two of vinyl polymer alkaline soluble resins containing urea bonds in their side chains, the vinyl copolymer alkaline soluble resins having different copolymer compositions.

6. A photosensitive composition according to claim 5, wherein the resin mixture is a mixture of;

a vinyl polymer alkaline soluble resin containing as copolymer units an ethylenic unsaturated monomer having urea bonds, (meth)acrylonitrile, and (meth)acrylamide; and a vinyl polymer alkaline soluble resin containing as copolymer units an ethylenic unsaturated monomer having urea bonds and a different copolymerizable polymerizable monomer, the ethylenic unsaturated monomer being contained as a copolymer unit in the amount of 20 to 80 parts per 100 parts by weight of the vinyl polymer alkaline soluble resin.

7. A photosensitive composition according to claim 1 which is employed as a positive working composition, wherein the photosensitive compound (B) is o-naphthoquinone diazido compound.

8. A photosensitive composition according to claim 1 which is employed as a negative working composition, wherein the photosensitive compound (B) is selected from the group consisting of a photosensitive diazonium compound;

a combination of a compound having an ethylenic unsaturated group and a photopolymerization initiator; and a combination of a photosensitive diazonium compound, a compound with an ethylenic unsaturated group, and a photopolymerization initiator.

9. A photosensitive composition for use in a planographic printing plate, which is an admixture comprising a resin (A) having urea bonds in its side chains; and a photosensitive compound (B);

wherein the resin (A) contains at least one alkaline soluble resin (a) selected from the group consisting of a vinyl polymer resin and a condensation polymer resin, the resin (a) having in its side chains urea bonds and a benzene ring to which a functional group selected from the group consisting of hydroxyl group and sulfonamide group is bonded.

10. A photosensitive planographic printing plate comprising a metallic support layer and a photosensitive layer, wherein the photosensitive layer is an admixture comprising as essential components a resin (A) having urea bonds in its side chains and a photosensitive compound (B); and wherein the resin (A) contains at least one alkaline soluble resin (a) selected from the group consisting of a vinyl polymer resin and a condensation polymer resin, the resin (a) having in its side chains urea bonds and a benzene ring to which a functional group selected from the group consisting of hydroxyl group and sulfonamide group is bonded.

11. A durable planographic printing plate obtained by a baking treatment of the photosensitive planographic printing plate according to claim 10, after light exposure and development.

12. A photosensitive composition according to claim 1, wherein the functional group is bonded to position 4 of the benzene ring.

13. A photosensitive composition according to claim 1, wherein the functional group is located at an end of the side chain.

14. A photosensitive composition according to claim 1, wherein the resin (a) contains structural units represented by one of formulae I a and I c:

wherein, $R^1$ and $R^2$ respectively represent a hydrogen atom, halogen atom, alkyl group, aryl group, carboxyl group, or a salt thereof; $R^3$ represents a hydrogen atom, halogen atom, alkyl group, or aryl group; X indicates a bivalent linking group; and Y represents a bivalent aromatic group.

15. photosensitive composition for use in a planographic printing plate according to claim 9, wherein the functional group is bonded to position 4 of the benzene ring.

16. A photosensitive composition for use in a planographic printing plate according to claim 9, wherein the functional group is located at an end of the side chain.

17. A photosensitive composition for use in a planographic printing plate according to claim 9, wherein the resin (a) contains structural units represented by one of formulae I a and I c:

wherein, $R^1$ and $R^2$ respectively represent a hydrogen atom, halogen atom, alkyl group, aryl group, carboxyl group, or a salt thereof; $R^3$ represents a hydrogen atom, halogen atom, alkyl group, or aryl group; X indicates a bivalent linking group; and Y represents a bivalent aromatic group.

18. A photosensitive planographic printing plate according to claim 10, wherein the functional group is bonded to position 4 of the benzene ring.

19. A photosensitive planographic printing plate according to claim 10, wherein the 20. A photosensitive planographic printing plate according to claim 10, wherein the resin (a) contains structural units represented by one of formulae I a and I c:

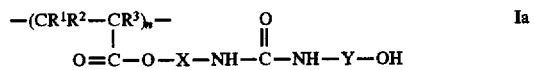
Ia

-continued

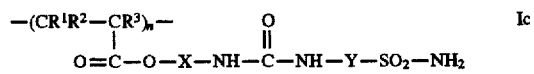
Ic wherein, $R^1$ and $R^2$ respectively represent a hydrogen atom, halogen atom, alkyl group, aryl group, carboxyl group, or a salt thereof; $R^3$ represents a hydrogen atom, halogen atom, alkyl group, or aryl group; X indicates a bivalent linking group; and Y represents a bivalent aromatic group.

* * * * *